US009097750B2

(12) United States Patent
Pradhan

(10) Patent No.: US 9,097,750 B2
(45) Date of Patent: Aug. 4, 2015

(54) DUAL PURPOSE ATOMIC DEVICE FOR REALIZING ATOMIC FREQUENCY STANDARD AND MAGNETIC FIELD MEASUREMENT

(71) Applicant: THE SECRETARY, DEPARTMENT OF ATOMIC ENERGY, Mumbai (IN)

(72) Inventor: Swarupananda Pradhan, Mumbai (IN)

(73) Assignee: GOVT. OF INDIA ANUSHAKTI BHAVAN, CHATRAPATI SHIVAJI MAHARAJ MARG, Mumbai-Maharashtra (IN)

(*) Notice: Subject to any disclaimer, the term of this patent is extended or adjusted under 35 U.S.C. 154(b) by 172 days.

(21) Appl. No.: 13/924,580

(22) Filed: Jun. 23, 2013

(65) Prior Publication Data

US 2014/0197826 A1 Jul. 17, 2014

(30) Foreign Application Priority Data

Jan. 17, 2013 (IN) .......................... 151/MUM/2013

(51) Int. Cl.
*G01R 33/32* (2006.01)
*G01R 33/032* (2006.01)
*H03L 7/26* (2006.01)

(52) U.S. Cl.
CPC ................ *G01R 33/032* (2013.01); *H03L 7/26* (2013.01)

(58) Field of Classification Search
CPC ...................................................... G01R 33/032
USPC ...................................................... 324/244.1
See application file for complete search history.

(56) References Cited

U.S. PATENT DOCUMENTS 6,320,472 B1 * 11/2001 Vanier .......................... 331/94.1
2010/0188081 A1 * 7/2010 Lammegger ................. 324/304
2012/0113423 A1 * 5/2012 Groswasser .................. 356/367

* cited by examiner

*Primary Examiner* — Arleen M Vazquez
*Assistant Examiner* — Brent J Andrews
(74) *Attorney, Agent, or Firm* — Neifeld IP Law, PC

(57) ABSTRACT

A dual purpose atomic device (DAD) for realizing atomic frequency standard and/or magnetic field measurement based on a hybrid technique comprising of enhanced transmission and polarization rotation by the CPT states is invented. The dual purpose atomic device for realizing atomic frequency standard and/or magnetic field measurement basically involving means for generating bi-chromatic field to facilitate the creation of CPT state in an atomic cell and stabilizing the frequency difference among the said bi-chromatic field to the center of the CPT resonance and thereby realizing atomic frequency standard and/or means for monitoring and analyzing transmitted polarization rotation signal from the CPT enabled atomic gas in a sample cell for measuring magnetic field without scanning the radiofrequency oscillator.

10 Claims, 2 Drawing Sheets

DUAL PURPOSE ATOMIC DEVICE FOR REALIZING ATOMIC FREQUENCY STANDARD AND MAGNETIC FIELD MEASUREMENT

CROSS REFERENCE TO RELATED APPLICATIONS

This application claims priority to India Application No. 151/MUM/2013, filed Jan. 17, 2013. The above-referenced application is incorporated by reference in its entirety.

FIELD OF THE INVENTION

The present invention relates to an atomic device and, in particular, a dual purpose atomic device (DAD) for realizing atomic frequency standard and/or magnetic field measurement. Importantly, the said dual purpose atomic device of the invention is adapted to measure the amplitude and orientation of the magnetic field based on polarization rotation signal from a coherent population trapping (CPT) enabled atomic gas in a sample cell with a provision of changing the range of the measurement of the magnetic field by adjusting the width of the CPT signal. Advantageously, the measurement of the magnetic field involving the atomic device of the invention is free of involvement of any bias magnetic field or any scanning operation across the CPT signal. The device is further adapted for possible miniaturization to length scale in the order of several microns without compromising its functional ability and useful for applications where atomic frequency standard and high sensitive measurement of magnetic field are simultaneously or independently required.

BACKGROUND ART

Presently atomic frequency standard based timekeeping devices like atomic clocks are essential component for precise and accurate scaling and measurement of time in different applications like global positioning system, high speed networking, telecommunication industry or in advance physics experiment. The magnetometer has also become increasingly important in different space, bio-medical and geophysical mapping applications for the measurement of magnetic field. Thus, it is apparent that, atomic timekeeping device and magnetometer both are required in any unique application where atomic frequency standard and high sensitive measurement of magnetic field are simultaneously required.

One of the leading techniques for precise time keeping relies on ultra narrow resonance spectral profile generated by CPT in atomic ensemble by using quantum interference phenomena. Such technique offers unique advantage of miniaturizing the whole device to chip scale as has been demonstrated by S. Knappe, V. Shah, P. D. D. Schwindt, L. Hollberg, J. Kitching, L Liew and J. Moreland, App. Phys. Lett., 85, 1460 (2004). The quantum interference phenomena also provide the physics basis for development of high sensitive chip scale atomic magnetometers as illustrated in P. D. D. Schwindt, S. Knappe, V. Shah, L. Hollberg, and J. Kitching, Appl. Phys. Lett., 85, 6409 (2004).

The CPT in such atomic system is realized by simultaneously coupling two excitation pathways with a common energy level. Here, the ultra narrow spectral profile is generated without using microwave cavity, thereby offering miniaturization of the atomic sensors. The field insensitive transition is used as the atomic frequency reference. The separation between the field insensitive transition and field sensitive transition, measured by scanning the radiofrequency oscillator, gives the value of magnetic field.

The intriguing aspects of polarization rotation of the CPT state in the low field regime, where Larmor's frequency is smaller than the spectral width illustrated interesting features as has been studied by S. Pradhan et al. in App. Phys. Lett., 100, 173502 (2012). According to the said prior art the CPT signal and the polarization rotation signal are significantly enhanced for a Zeeman degenerate system and it has been pointed out in the art that the zero crossing of the CPT profile is insensitive to the applied magnetic field, where as the zero crossing of the polarization rotation signal varies linearly with the field amplitude. Here also measurement of magnetic field requires the scanning of radiofrequency oscillator across the absorptive and dispersive profile of the CPT states.

There are some patent documents exists dealing with such atomic system or device for realizing atomic frequency standard or measuring magnetic field.

U.S. Pat. No. 6,320,472 B1 discloses an atomic frequency standard based on the ground state hyperfine resonance line observed by means of coherent radiation fields creating CPT in an alkali metal atomic ensemble contained in a cell. The CPT state created by a bi-chromatic field is used to stabilize the radiofrequency oscillator, which constitute the atomic clock. This method can only provide atomic frequency standard.

U.S. Pat. No. 6,265,945 B1 also discloses an atomic frequency standard based upon coherent population trapping but similar to the previous system method for operation of the atomic frequency standard of US '945 is not suitable for simultaneous magnetic field measurement.

US 2010/0188081 reports a method and device for measuring magnetic field which makes use of the Zeeman effect for measuring magnetic fields, by way of CPT resonances. The method describes measurement of magnetic field by monitoring the frequency separation between the CPT resonances, thus this technique requires scanning of the radiofrequency oscillator for measurement of magnetic field. This not only become cumbersome, but the device no longer function as an atomic frequency standard.

EP/I029540/1 involves a proposal for development of atomic frequency standard and atomic magnetometer based of coherent population trapping effect in atomic vapour such as Rubidium and Cesium atomic vapour loaded into hallow core optical fibre. This proposal envisaged use of hallow core optical fibre for confining the atomic vapour instead of conventional glass cell. Like conventional CPT based device it cannot simultaneously provide atomic frequency standard and measure magnetic field. It also requires scanning of the radiofrequency oscillator for measurement of magnetic field.

Thus there has been always a need for single atomic device which can provide atomic frequency standard and/or measure magnetic field simultaneously without involving any scanning operation and thus the device should be adapted to be used in any type applications where atomic frequency standard and high sensitive measurement of magnetic field are simultaneously or independently required.

OBJECT OF THE INVENTION

It is thus the basic object of the present invention is to develop a dual purpose atomic device capable of performing dual operations such as realizing atomic frequency standard and/or magnetic field measurement.

Another important object of the present invention is to provide atomic device for realizing atomic frequency standard and measuring magnetic field simultaneously based on polarization rotation and amplitude modification of light field by a CPT enabled atomic gas in a sample cell.

It is thus another important object of the present invention is to provide an atomic device which would be adapted to measure the magnetic field without involving any scanning operation across the CPT states.

Another object of the present invention is to provide an atomic device which would be adapted to measure the orientation of a magnetic field without using any additional field.

A further object of the present invention is directed to provide an atomic device which would be adapted to customize the range of the measurement of magnetic field.

A further object of the present invention is to provide an atomic device which could be adapted for possible miniaturization to length scale in the order of several microns.

Another object of the present invention is to provide a highly sensitive atomic device capable of giving atomic frequency standard as well as for the measurement of magnetic field in different application like global positioning system, high speed networking, telecommunication industry, metrological application, bio-magnetism, geophysical mapping or in different advance physics experiment.

SUMMARY OF THE INVENTION

Thus according to the basic aspect in the present invention there is provided a dual purpose atomic device for realizing atomic frequency standard and/or magnetic field measurement comprising means for generating bi-chromatic field to facilitate the creation of CPT state in an atomic cell and stabilizing the said bi-chromatic field to the center of the CPT resonance and thereby realizing atomic frequency standard and/or means for monitoring and analyzing polarization rotation signal from the CPT enabled atomic gas in a sample cell for measuring magnetic field.

According to another aspect in the present invention, the dual purpose atomic device for realizing atomic frequency standard and/or magnetic field measurement comprising of a hybrid technique of enhanced transmission and polarization rotation by the CPT states.

According to yet another aspect in the present invention, the dual purpose atomic device for realizing atomic frequency standard and/or magnetic field measurement comprises
a) a laser diode adapted to be frequency modulated to generate a bi-chromatic field coupling both ground hyperfine level of the concern atom of the atomic cell to a common excited level;
b) atomic cell containing alkali metal atoms preferably Rubidium
c) a radiofrequency generator involving a voltage control oscillator (VCO), synthesizer and a modulator to frequency modulate laser diode at the sub-harmonic of the ground hyperfine splitting of the concern alkali metal atom;
d) Polarization filter and retardation plate adapted to impose desired polarization, preferably slightly imbalanced plane polarization in the bi-chromatic light;
e) an analyzer for the transmitted beam and a pair of photo detector for monitoring the transmission and reflection by the analyzer;
f) a signal processing and control loop adapted to lock the laser frequency to the concerned optical transition using transmitted signal of the analyzer acquired by a photodiode;
g) a signal processing unit for the transmitted light by the analyzer, acquired with a photodiode and a control loop to lock the VCO frequency to the transmission signal due to CPT states, also popularly known as CPT signal.
h) a signal processing unit for the reflected light by the analyzer, acquired with a photodiode for monitoring component of the magnetic field along the laser propagation direction.

In accordance with another aspect in the dual purpose atomic device for realizing atomic frequency standard and/or magnetic field measurement, the polarity of reflected signal by the analyzer provides the orientation of the magnetic field.

According to another aspect in the said dual purpose atomic device, the amplitude of the reflected signal by the analyzer provides the magnitude of the magnetic field.

According to a further important aspect in the said dual purpose atomic device, the measurement of magnitude and orientation of the magnetic field is free from the involvement of any bias magnetic field or scanning across the CPT resonances.

According to yet another aspect in the said dual purpose atomic device, the range of the measurement of magnetic field can be changed by increasing or decreasing the width of the CPT signal.

In accordance with another aspect in the said dual purpose atomic device, the CPT signal width decreasing means involves buffer gas filled atomic cell or anti-relaxation coated atomic cell and the CPT signal width increasing means involves means for reducing the beam diameter or increasing the laser intensity or increasing the modulation amplitude of the radio frequency oscillator operating in the wavelength modulation regime.

According to another aspect in the present system, the said dual purpose atomic device for realizing atomic frequency standard and/or magnetic field measurement is adapted for possible miniaturization to length scale in the order of several microns without compromising its functional ability.

In accordance with another aspect in the said dual purpose atomic device, the CPT signal is preferably obtained in the low field regime where Larmor's frequency is smaller than the width of the CPT signal.

In accordance with another aspect in the present system the method for realizing atomic frequency standard with simultaneous magnetic field measurement in non-scanning manner involving the said dual purpose atomic device comprising the steps of
a) generating bi-chromatic plane polarized laser beam having small imbalance of ~1% in the orthogonal circular polarization component;
b) passing the bi-chromatic plane polarized laser beam through the atomic cell;
c) monitoring and analyzing the light amplitude modification due to bare and CPT states involving the analyzer placed after the atomic cell;
d) stabilizing the laser frequency to the absorption signal due to bare atomic state;
e) stabilizing the frequency of the VCO to the center of the CPT signal; and
f) monitoring the polarization rotation due to CPT states from the reflected signal by the analyzer.

The details of the invention, its objects and advantages are explained hereunder in greater detail in relation to the following non-limiting exemplary illustrations in relation to the following accompanying figures.

BRIEF DESCRIPTION OF THE ACCOMPANYING FIGURES

DETAILED DESCRIPTION OF THE INVENTION WITH REFERENCE TO THE ACCOMPANYING FIGURES

As per the basic aspect, the present invention is directed to develop a unique device enabling the scanning free direct measurement of magnetic field with simultaneous realization of atomic frequency standard based on a hybrid technique which involves transmission and polarization rotation by CPT states in an atomic cell. The reported dual purpose atomic device is also adapted for possible miniaturization to length scale in the order of several microns without compromising its functional ability.

Figure 1:
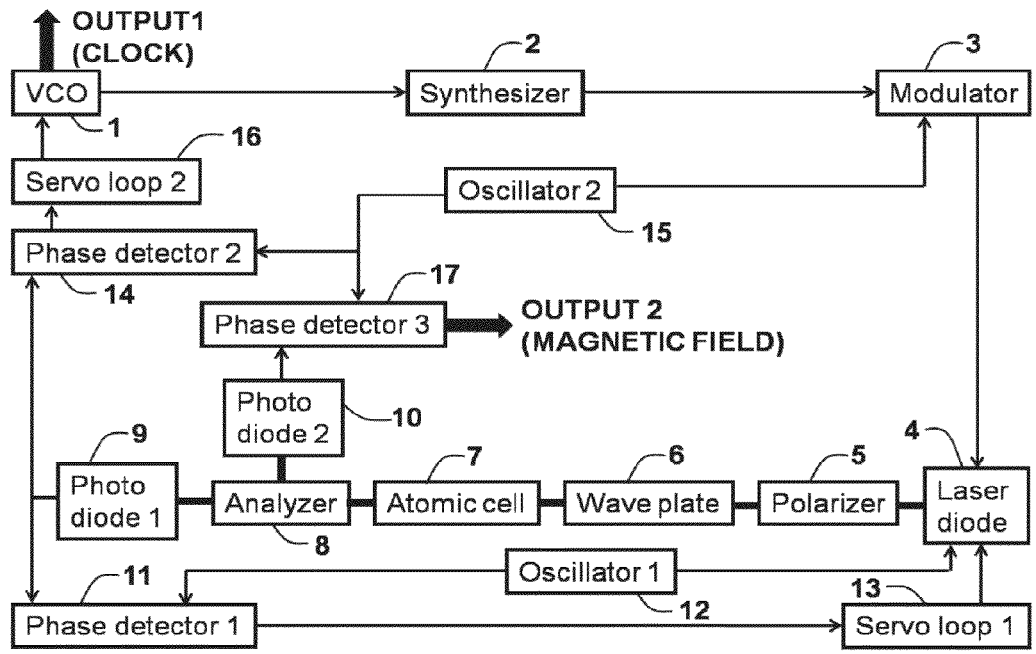
FIG. 1 shows the Schematic diagram of a preferred embodiment the atomic device in accordance with the present invention.

Reference is first invited from the FIG. 1 which schematically represents a preferred embodiment of the present dual purpose atomic device for realizing atomic frequency standard and magnetic field measurement with non-scanning operation. As shown in the figure, a vertical cavity surface emitting laser diode (4) is provided to generate a bi-chromatic field coupling both ground hyperfine level of the concern atom of the atomic cell to a common excited level. A radiofrequency oscillator assembly which includes VCO (1), synthesizer (2) and a modulator (3) is provided in the present device to frequency modulate the laser light at ~1.517 GHz and synthesize it to favour the generation of bi-chromatic light. The bi-chromatic light generated by the laser diode (4) is passed through a polarizer (5) and a waveplate (6). The role of the waveplate (6) in the present system is to provide slight imbalance between the orthogonal circular polarization components of the said bi-chromatic light. Polarization state and amplitude of the transmitted light after interaction with the atomic cell (7) is monitored with an analyzer (8) and two photodiodes (9, 10). The signal output of the photo diode 1 (9) is phase sensitively detected with phase detector 1 (11) at a reference frequency generated by the oscillator 1 (12). The oscillator 1 (12) is used to modulate the diode laser current for modulation spectroscopy. The output of the phase detector 1 (11) is used to stabilize the laser frequency at the desired value with the help of a servo loop 1 (13). The output of the photo diode 1 (9) is also demodulated by the phase detector 2 (14) at reference frequency generated by the oscillator 2 (15). The oscillator 2 (15) is used to impose frequency modulation in the radio frequency through the modulator (3). The output of the phase detector 2 (14) is used to stabilize the VCO (1) frequency at the centre of the CPT signal with the help of the servo loop 2 (16). The reference output of the stabilized VCO frequency provides the atomic frequency standard. The output of the photo diode 2 (10) is demodulated by the phase detector 3 (17) at the reference frequency of oscillator 2 (15). The output of phase detector 3 (17) provides the amplitude and polarity of the magnetic field. It should be noted that, in the present device the CPT signal is obtained in the low field regime where Larmor's frequency is smaller than the width of the CPT signal.

Figure 2:
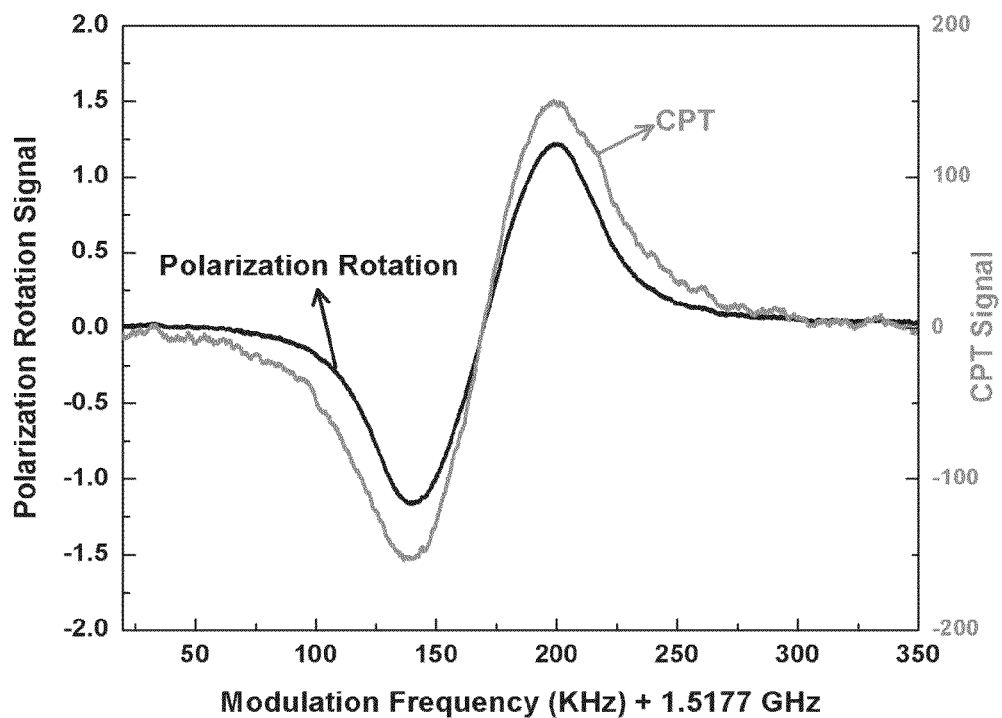
FIG. 2 illustrates the derivative profile of transmission (CPT) and polarization rotation signal due to CPT states obtained by modulation spectroscopy.

Reference is next invited from the FIG. 2 which illustrates the derivative profile of transmission and polarization rotation signal due to CPT states using frequency modulation spectroscopy. The CPT and polarization rotation signal with a slightly imbalanced light polarization is illustrated in the present figure by the gray and black solid line respectively. The CPT and polarization rotation signal is obtained from the output of phase detector 2 (14) and phase detector 3 (17) respectively as illustrated in figure-1. The abscissa represents the modulation frequency applied to the laser diode generated by the VCO, synthesizer and modulator shown in FIG. 1. The centers of the CPT and polarization rotation signal (zero crossing) are found to be coinciding at ~0 mG. The higher SNR of polarization rotation signal compared to the CPT signal is beneficial for the metrological application.

Figure 3:
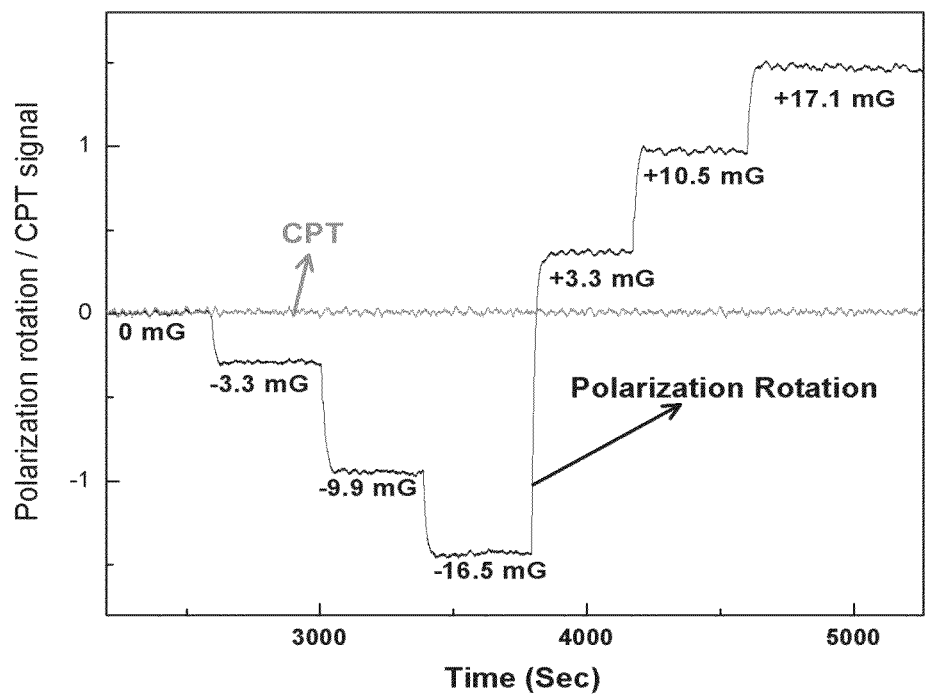
FIG. 3 shows the polarization rotation signal or the CPT signal variation of the present device after stabilizing the VCO frequency to the centre of the CPT signal at various magnetic fields FIG. 4 schematically illustrates the dependence of the polarization rotation signal on the amplitude and direction of the magnetic field

Reference is now invited from the FIG. 3 shows the polarization rotation signal or the CPT signal variation of the present system after stabilizing the VCO frequency to the centre of the CPT signal using a servo loop. The centre of the CPT signal corresponds to the zero crossing of the CPT profile illustrated in FIG. 2. The error signal is shown by the gray line marked as CPT with respect to time in second. The output of the phase detector 2 (17) shown in FIG. 1 is found to be changing its amplitude and polarity depending on the magnitude and direction of the magnetic field respectively (shown as the black line marked as polarization rotation). Thus a single device is demonstrated as providing the atomic frequency standard as well as operating as a magnetic field sensor. The co or counter orientation of the magnetic field with respect to the laser beam is determined as it alters the polarity of the polarization rotation signal.

The amplitude of the polarization rotation signal is found to be proportional to the magnitude of the magnetic field and its polarity is established to be changing with the orientation of the magnetic field with the laser beam as shown in FIG. 3. Therefore direction and amplitude of the magnetic field component can be measured without need of a bias magnetic field or any requirement of scanning the VCO frequency.

Figure 4:
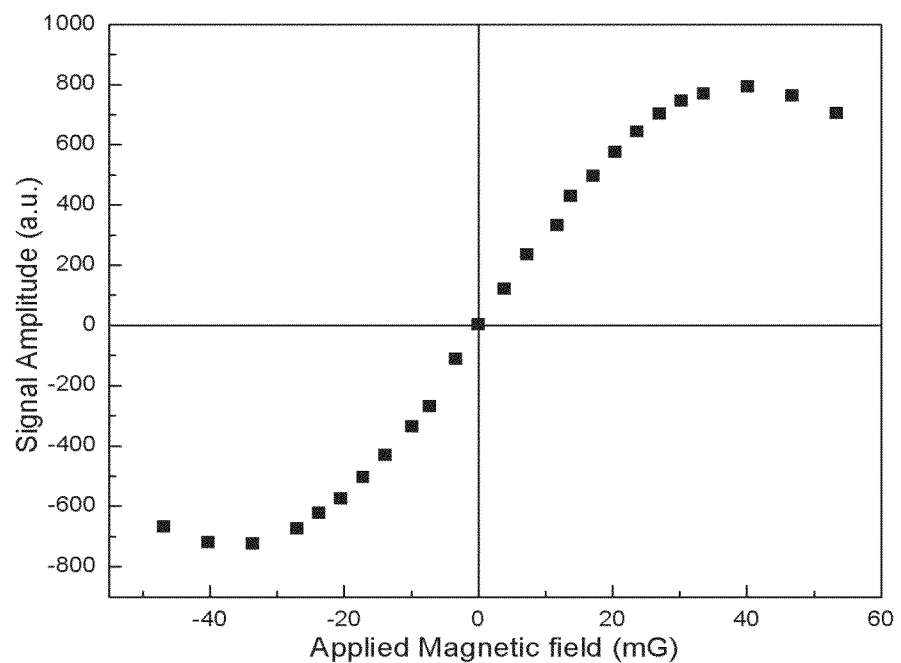

Reference is next invited from the accompanying FIG. 4 which shows the variation of the polarization rotation signal as a function of the applied magnetic field. In particular the said figure illustrates the dependence of the signal amplitude and polarity of the polarization rotation signal on the amplitude and direction of the applied magnetic field. As can be seen in the said figure, the amplitude varies linearly with the applied magnetic field up to ~±18 mG, which constitutes the preferred operating regime (dynamic range) of the magnetometer. The signal amplitude of the polarization rotation signal varies proportional to the applied magnetic field up to ±33 mG.

The range of the measurement of magnetic field can be changed by increasing or decreasing the width of the CPT signal. More specifically, The CPT signal width can be decreased by using buffer gas filled atomic cell or anti-relaxation coated atomic cell and the CPT signal width can be increased by reducing the beam diameter or increasing the laser intensity or increasing the modulation amplitude of the radio frequency oscillator operating in the wavelength modulation regime.

Operation of the System

The method for realizing atomic frequency standard with simultaneous magnetic field measurement in non-scanning manner by using single system or atomic device as presented in the FIG. 1 based on amplitude and polarization modification of the light beam due to CPT states comprises a vertical cavity surface emitting laser which is modulated at half of the ground state hyperfine splitting to generate a bi-chromatic field. The generated laser beam is then made plane polarized and a small imbalance of ~1% is introduced in the orthogonal circular polarization component and passed through Rubidium atomic cell. The light amplitude modification due to bare and CPT states, popularly known as absorption and CPT signal respectively are monitored from the transmitted signal by the analyzer placed after the atomic cell and the polarization rotation due to CPT states is monitored from the reflected signal by the analyzer. The laser frequency is stabilized to the absorption signal obtained with the bare atomic states. The frequency difference between the bi-chromatic fields is tuned to create the CPT states. The VCO is frequency stabilized to the centre of the CPT signal, which constitute the atomic clock part of the device. The polarization rotation signal due to CPT states is monitored under the VCO locked to the CPT signal. The amplitude and polarity of the polarization rotation signal is used for measurement of magnetic field. The device operates in the regime where Larmor's frequency is smaller than the width of the CPT signal.

The involvement of the polarization rotation due to CPT states for the measurement of the magnetic field in the present device ensures high signal to noise ratio as the polarization rotation signal is extracted from vanishingly small background light field. Thus the present dual purpose atomic device is beneficial for achieving higher sensitivity in the measurement of magnetic field along with an atomic frequency standard for different application like global positioning system, high speed networking, telecommunication industry, bio-magnetism, metrological application or in different advance physics experiment.

I claim:

1. A dual purpose atomic device for realizing atomic frequency standard and simultaneous magnetic field measurement comprising:
   an atomic cell containing alkali metal atoms;
   means for generating bi-chromatic field to facilitate the creation of CPT state in the atomic cell in the low field regime wherein Larmor's frequency is smaller than width of CPT signal and stabilizing the said bi-chromatic field to the center of CPT resonance involving transmission and polarization modification by the CPT state including a radio frequency generator having a VCO to frequency modulate a laser diode generating the bi-chromatic field whereby reference output of stabilized VCO frequency at centre of CPT signal provides atomic frequency standard and
   means for monitoring and analyzing amplitude and polarization modification of light beam due to the CPT state under the VCO frequency stabilized at the centre of the CPT signal for measuring magnetic field.

2. A dual purpose atomic device for realizing atomic frequency standard and simultaneous magnetic field measurement comprising:
   an atomic cell containing alkali metal atoms preferably Rubidium; means for generating bi-chromatic field to facilitate the creation of CPT state in the atomic cell and stabilizing said bi-chromatic field to center of CPT signal and thereby realizing atomic frequency standard involving transmission and polarization modification by the CPT states including:
   a laser diode adapted to be frequency modulated to generate a bichromatic field coupling both ground hyperfine level of the concern atom of the atomic cell to a common excited level;
   a radio frequency generator involving a VCO, synthesizer and a modulator to frequency modulate laser diode at the sub-harmonic of the ground hyperfine splitting of the concern alkali metal atom;
   polarization filter and retardation plate adapted to impose desired polarization, preferably slightly imbalanced plane polarization in the bichromatic light;
   an analyzer for the transmitted beam and a pair of photo detector for monitoring the transmission and reflection by the analyzer;
   a signal processing and control loop adapted to lock the laser frequency to the concerned optical transition using transmitted signal of the analyzer acquired by a photodiode;
   a signal processing unit for the transmitted light by the analyzer, acquired with a photodiode and a control loop to lock the VCO frequency at centre of the CPT signal for realizing the atomic frequency standard; and
   means for measuring the magnetic field including a signal processing unit for the reflected light by the analyzer, acquired with a photodiode for monitoring component of the magnetic field along the laser propagation direction.

3. The dual purpose atomic device for realizing atomic frequency standard and simultaneous magnetic field measurement as claimed claim 2 wherein the polarity of the reflected signal by the analyzer provides the orientation of the magnetic field.

4. The dual purpose atomic device for realizing atomic frequency standard and simultaneous magnetic field measurement as claimed claim 2 wherein amplitude of the reflected signal by the analyzer provides the magnitude of the magnetic field without any requirement of scanning the radiofrequency oscillator.

5. The dual purpose atomic device for realizing atomic frequency standard and simultaneous magnetic field measurement as claimed in claim 2 is adapted to measure the magnitude and orientation of the magnetic field free of involvement of any bias magnetic field.

6. The dual purpose atomic device for realizing atomic frequency standard and simultaneous magnetic field measurement as claimed in claim 2 wherein the range of the measurement of magnetic field is changed by increasing or decreasing the width of the CPT signal.

7. The dual purpose atomic device for realizing atomic frequency standard and simultaneous magnetic field measurement as claimed in claim 2 comprises buffer gas filled atomic cell or anti-relaxation coated atomic cell for decreasing the CPT signal width and the width of the CPT signal is increased by reducing the beam diameter or increasing the laser intensity or increasing the modulation amplitude of the radio frequency oscillator operating in the wavelength modulation regime.

8. The dual purpose atomic device for realizing atomic frequency standard and simultaneous magnetic field measurement as claimed in claim 2 adapted for possible miniaturization to length scale in the order of several microns without compromising its functional ability.

9. The dual purpose atomic device for realizing atomic frequency standard and simultaneous magnetic field measurement as claimed in claim 2 wherein the CPT signal is obtained in the low field regime where Larmor's frequency is smaller than the width of the CPT signal.

10. A method for realizing atomic frequency standard with simultaneous magnetic field measurement in non-scanning manner involving the device as claimed in claim 2 comprising the steps of
   a) generating bi-chromatic plane polarized laser beam having small imbalance of ~1% in the orthogonal circular polarization component;

b) passing the bi-chromatic plane polarized laser beam through the atomic cell;
c) monitoring and analyzing the light amplitude modification due to bare and CPT states involving the analyzer placed after the atomic cell;
d) stabilizing the laser frequency to the absorption profile due to bare atomic state;
e) frequency stabilizing the VCO to the center of the CPT signal; and
f) monitoring the polarization modification due to CPT states from the reflected signal by the analyzer.

* * * * *

UNITED STATES PATENT AND TRADEMARK OFFICE
CERTIFICATE OF CORRECTION

| | | |
|---|---|---|
| PATENT NO. | : 9,097,750 B2 | Page 1 of 1 |
| APPLICATION NO. | : 13/924580 | |
| DATED | : August 4, 2015 | |
| INVENTOR(S) | : Pradhan | |

It is certified that error appears in the above-identified patent and that said Letters Patent is hereby corrected as shown below:

Title Page item (73) change

"GOVT. OF INDIA ANUSHAKTI BHAVAN, CHATRAPATI SHIVAJI MAHARAJ MARG,"

to

-- THE SECRETARY, DEPARTMENT OF ATOMIC ENERGY, GOVT. OF INDIA, ANUSHAKTI BHAVAN, CHATRAPATI SHIVAJI MAHARAJ MARG, MUMBAI, MAHARASHTRA, INDIA --

Signed and Sealed this
Twenty-sixth Day of July, 2016

Michelle K. Lee
*Director of the United States Patent and Trademark Office*